United States Patent [19]

Tamesue et al.

[11] Patent Number: 5,606,284
[45] Date of Patent: Feb. 25, 1997

[54] AUTOMATIC GAIN CONTROL DEVICE FOR PRODUCING CONSTANT AMPLITUDE OUTPUT SIGNAL

[75] Inventors: Kazuhiko Tamesue; Koichi Nagano, both of Fukuoka; Masuo Nakamura, Kyoto, all of Japan

[73] Assignee: Matsushita Electric Industrial Co., Ltd., Osaka, Japan

[21] Appl. No.: 518,977

[22] Filed: Aug. 24, 1995

[30] Foreign Application Priority Data

Aug. 26, 1994 [JP] Japan .................................. 6-202201

[51] Int. Cl.⁶ ...................................................... H03G 3/20
[52] U.S. Cl. ............................ 330/129; 330/51; 330/135; 330/136; 330/279; 455/126
[58] Field of Search .............................. 330/51, 129, 135, 330/136, 279; 455/116, 126, 234.2, 239.1

[56] References Cited

U.S. PATENT DOCUMENTS 4,360,787   11/1982   Galpin .
4,371,842    2/1983   Lee .
4,574,248    3/1986   Snodgrass ........................... 330/136 X
4,760,347    7/1968   Li et al. .

FOREIGN PATENT DOCUMENTS 92009    7/1980   Japan ......................................... 330/51
5-14089  1/1993   Japan .

*Primary Examiner*—James B. Mullins
*Attorney, Agent, or Firm*—McDermott, Will & Emery

[57] ABSTRACT

A variable gain amplifying circuit is controlled by a control voltage Vc from which a high-frequency component has been removed. To provide the control voltage Vc, a holding circuit smoothes the higher one of an output voltage of the variable gain amplifying circuit, which has been rectified by a rectifying circuit, and a voltage detected by a minute voltage detecting circuit, so that the control voltage Vc is obtained via a direct-current amplifying circuit. Since the clamping circuit varies the control voltage Vc based on a reference voltage Vref on receiving a minute input signal, even when an AGC characteristic is changed by varying the reference voltage Vref, the minimum gain is always corrected to be constant.

13 Claims, 14 Drawing Sheets

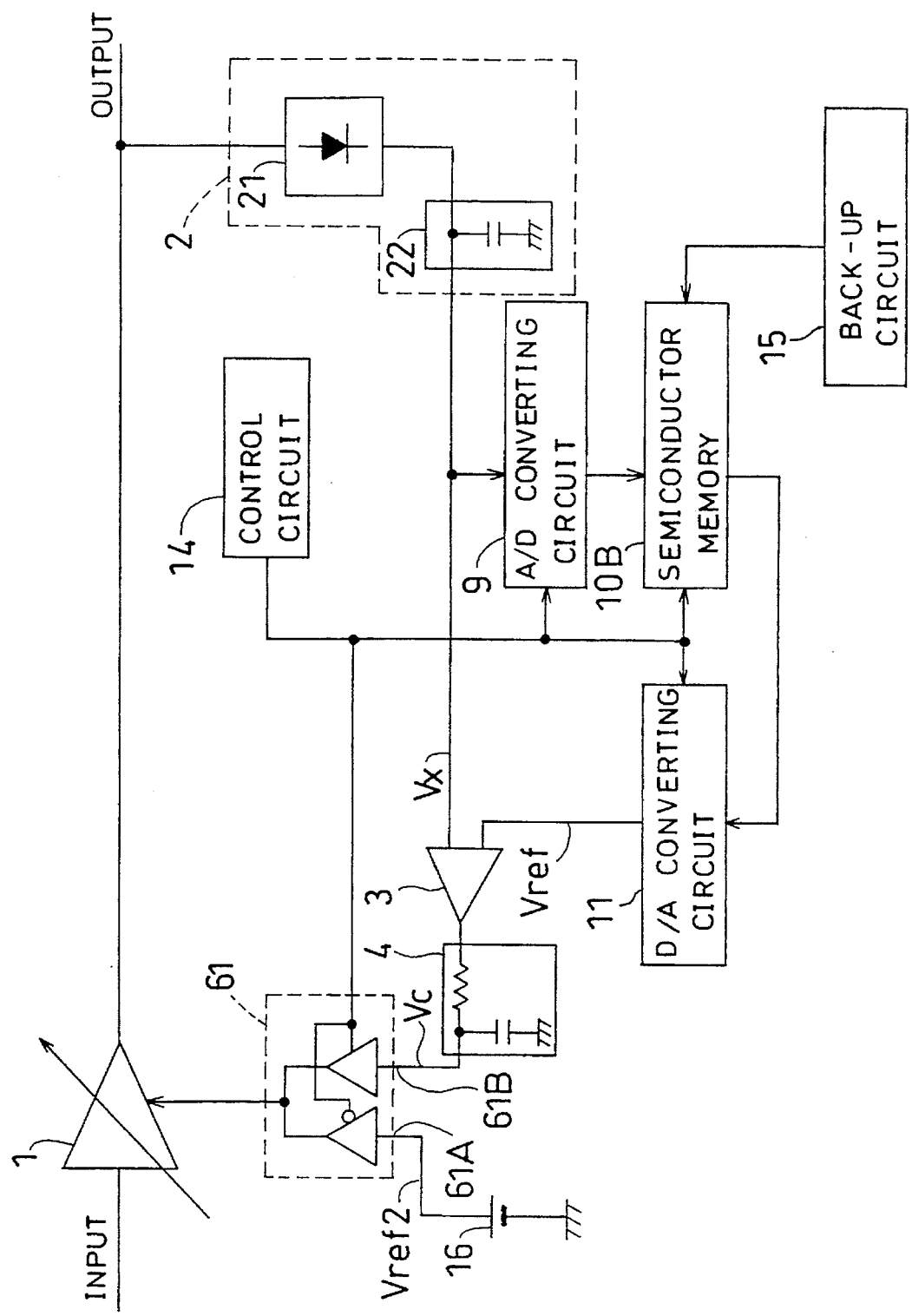

AUTOMATIC GAIN CONTROL DEVICE FOR PRODUCING CONSTANT AMPLITUDE OUTPUT SIGNAL

BACKGROUND OF THE INVENTION

The present invention relates to an automatic gain control device for controlling, in a communication system or in an audio system, the gain of a variable gain amplifying circuit depending on the amplitude of an input signal so as to produce an output signal having a constant amplitude and to suppress a variation in the input signal.

Referring now to the drawing, a description will be given below to a conventional automatic gain control device with which a variation in an input signal can be suppressed and from which a constant output signal can be obtained.

FIG. 11 is a view showing the structure of the conventional automatic gain control device. In the drawing are shown: a variable gain amplifying circuit 1 for amplifying an input signal depending on a gain controlled by a control voltage; a peak detecting circuit 2 for detecting and holding a peak value of an output voltage of the variable gain amplifying circuit 1; a rectifying circuit 21 for rectifying the input signal voltage; a holding circuit 22 for holding a peak value of the voltage rectified by the rectifying circuit 21; a direct-current amplifying circuit 3 for outputting a voltage proportional to a difference between the inputted voltage and a reference voltage; a low-pass filter 4 for removing a high-frequency component from the input voltage of the direct-current amplifying circuit 3 and outputting an effective voltage; a resistance-voltage dividing circuit 51 for generating an appropriate reference voltage from a power-source potential Vcc; a first resistor R1 for dividing the power-source potential Vcc; a second resistor R2 for dividing the power-source potential Vcc; a switching buffer circuit with a control terminal 61 for switching between the state in which the input signal passes through the variable gain amplifying circuit 1 and tile state in which the input signal does not pass through the variable gain amplifying circuit 1; an input terminal 61A to which the input signal is inputted directly; an input terminal 61B to which an output signal from the variable gain amplifying circuit 1 is inputted; an output terminal Y of the conventional automatic gain control device; a reference voltage Vref outputted from the resistance-voltage dividing circuit 51; a peak voltage Vx outputted from the peak detecting circuit 2; a control voltage Vc for controlling the variable gain amplifying circuit 1, which has been generated by the direct-current amplifying circuit 3 based on a difference between the peak voltage Vx and the reference voltage Vref and from which a ripple component has been removed by the low-pass filter 4; and the power source voltage Vcc for driving the device.

Below, the operation of the automatic gain control device thus constituted will be described with reference to the drawings.

FIGS. 12(a) to 12(c) are views each showing the AGC (Automatic Gain Control) characteristic of the conventional automatic gain control device. FIG. 12(a) is a view showing the relationship between the control voltage Vc and the gain of the conventional automatic gain control device, in which G0 designates a maximum gain and G9 designates a minimum gain.

FIG. 12(b) is a view showing the relationship between the peak voltage Vx and control voltage Vc of the direct-current amplifying circuit in which the reference voltage is held constant. In the drawing are shown: a value Vx1 of the peak voltage with which the gain becomes 0 dB when the reference voltage is Vr1 shown in FIG. 10(a); and a value Vc1 of the control voltage with which the gain of the variable gain amplifying circuit 1 becomes 0 dB when the peak voltage is Vx1.

FIG. 12(c) is a view showing the relationship between the voltage of the input signal of the conventional automatic gain control device and the voltage of the output signal thereof, each expressed in a logarithmic value. In the drawing are shown: a minimum value vin0 of the input signal voltage with which AGC becomes effective; a value vin1 of the input signal voltage with which the gain becomes 0 dB when the reference voltage is Vr1 shown in FIG. 10(a); a maximum value vin9 of the input signal voltage with which AGC becomes effective; the maximum gain G0; and the minimum gain G9. Since the gain decreases as the input signal voltage increases on the basis of vin1, while the gain increases as the input signal voltage decreases, the amplitude of the output signal voltage can be held constant.

As shown in FIG. 12(c), the gain becomes 0 dB when the control voltage is Vc1 shown in FIG. 12(b). When the reference voltage Vref inputted to the direct-current amplifying circuit 3 is varied from the standard value Vr1 to a higher value Vr3, the peak voltage shifts from the standard value Vx1 for outputting the control voltage Vc1 to a higher value, so that the input signal voltage also shifts from the standard value vin1 to a higher value vin3 with which the gain becomes 0 dB. Conversely, if the reference voltage Vref is varied to a value Vr2 shown in FIG. 10(a), the peak voltage shifts from the value Vx1 for outputting the control voltage Vc1 to a lower value, so that the gain becomes 0 dB when the input signal voltage is vin2, which is lower than the standard value vin1. Hence, the AGC characteristic of the automatic gain control device can be varied by varying the reference voltage Vref inputted to the direct-current amplifying circuit 3.

Next, a description will be given to a conventional automatic gain control device for voice with reference to the drawing.

FIG. 13 is a circuit diagram of the conventional automatic gain control device for voice. Here, a description will be given only to components newly added to the conventional automatic gain control device shown in FIG. 11. In FIG. 13 are shown: a clamping circuit 7 for holding constant an output voltage of a minute voltage detecting circuit when it exceeds a given value; a PNP transistor 72 which is brought into conduction when the output voltage of the minute voltage detecting circuit exceeds the given value; a constant-voltage power source 73 for determining the value of a clamping voltage; the minute voltage detecting circuit 8 for increasing the output voltage, as the input voltage is reduced, and rectifying it.

Below, the operation of the automatic gain control device thus constituted will be described with reference to the drawings.

FIGS. 14(a) and 14(b) are views showing the AGC characteristic of the conventional automatic gain control device for voice, of which FIG. 14(a) is a view showing the relationship between an input signal voltage and the control voltage Vc of the conventional automatic gain control device for voice and FIG. 14(b) is view showing the relationship between the input signal voltage and an output signal voltage of the conventional automatic gain control device for voice. In FIG. 14(a) are shown: an output voltage L1 of the rectifying circuit 21 shown in FIG. 13; an output voltage L2 of the minute voltage detecting circuit 8 shown in FIG. 13; an output voltage L3 of the clamping circuit 7 shown in FIG. 13; a value vin1 of the input signal voltage with which the gain becomes 0 dB when the reference voltage is Vr1 shown in FIG. 10(*a*); a value vin5 of the input signal voltage with which the output voltages of the minute voltage detecting circuit 8 and rectifying circuit 21 shown in FIG. 13 are equalized; a value vin6 of the input signal voltage with which the output voltages of the minute voltage detecting circuit 8 and clamping circuit 7 shown in FIG. 13 are equalized; and a value Vc1 of the control voltage when the peak voltage is Vx1, which corresponds to the values vin1 and vin6 of the input signal voltage with which the gain becomes 0 dB. In FIG. 14(*b*), G0 designates the maximum gain and G9 designates the minimum gain.

When the input signal voltage is smaller than vin1, the gain approaches the maximum value G0 and is eventually saturated. Even when the input signal voltage is extremely small, the gain is held at the maximum value without the minute voltage detecting circuit 8, resulting in an increase in noise. Since the minute voltage detecting circuit 8 generates a voltage higher than the voltage generated from the direct-current amplifying circuit 3 shown in FIG. 13 when the input signal voltage is vin5 or lower, the gain is reduced as shown in FIG. 14(*b*). On the other hand, the clamping circuit 7 is provided in order to forcibly apply the control voltage having the value of Vc1 to the variable gain amplifying circuit 3, since the gain becomes negative when the input signal voltage becomes lower than the vin6 only with the minute voltage detecting circuit 8.

With the above automatic gain control device for voice having the AGC characteristic, a large sound is attenuated, while a small sound has its S/N ratio improved, resulting in the reproduction of clear sounds.

However, the above conventional automatic gain control device has the following four problems: the first one is that a plurality of terminals are necessary for controlling the above conventional automatic gain control device, since the changing of the gain owing to the function of varying the reference voltage is separated from an AGC ON/OFF switching function; the second one is that the gain on receiving a minute input signal cannot be held at a constant value with respect to a variation in AGC characteristic when the reference voltage is variable; the third one is that it is impossible to freely set or store the AGC characteristic in accordance with an arbitrary level of the input signal; and the fourth one is that AGC ON/OFF switching cannot be performed at a high speed since the charging of the capacitance of the low-pass filter requires a considerably long period of time.

SUMMARY OF THE INVENTION

The present invention has been achieved in order to overcome the above conventional problems. It is therefore a first object of the present invention to facilitate the changing of the AGC characteristic based on the correction of the reference voltage and the AGC ON/OFF switching. It is a second object of the present invention to provide a constant minimum gain of the AGC characteristic. It is a third object of the present invention to enable the setting and storing of the AGC characteristic. It is a fourth object of the present invention to enable the AGC ON/OFF switching at a high speed.

A first automatic gain control device according to the present invention is for attaining the above first object and comprises: a variable gain amplifying circuit for amplifying or attenuating an input signal depending on a gain controlled by a control voltage; a rectifying circuit for rectifying an output signal of the variable gain amplifying circuit; a holding circuit for outputting a peak voltage of the voltage rectified by the rectifying circuit; a reference voltage generating circuit for outputting a reference voltage which varies in accordance with an external voltage; a direct-current amplifying circuit for outputting the above control voltage based on a difference between the above peak voltage and the above reference voltage; and a switching circuit for switching between the output signal of the above variable gain amplifying circuit and the above input signal on the basis of the above reference voltage.

Since the reference voltage generating circuit consists of a resistance dividing circuit and a voltage control switch such as an MOS transistor, only one terminal is sufficient to change the AGC characteristic by correcting the reference voltage and to implement the AGC ON/OFF switching, which facilitates the changing of the reference voltage and the switching of the operation of the automatic gain control device.

Moreover, the number of terminals can be reduced when the automatic gain control device is mounted on an IC chip, which advantageously reduces packaging cost.

Preferably, the first automatic gain control device further comprises a low-pass filter for removing a high-frequency component composed of a direct-current voltage from the above control voltage outputted from the above direct-current amplifying circuit. With the arrangement, since the low-pass filter removes the high-frequency component from the control voltage for controlling the variable gain amplifying circuit, the operation of the variable gain amplifying circuit is stabilized, which further improves the AGC characteristic.

A second automatic gain control device according to the present invention is for attaining the above first object, similarly to the first automatic gain control device, and comprises: a variable gain amplifying circuit for amplifying or attenuating an input signal depending on a gain controlled by a control voltage; a rectifying circuit for rectifying an output signal of the variable gain amplifying circuit; a low-pass filter for outputting an effective voltage of the voltage rectified by the rectifying circuit; a reference voltage generating circuit for outputting a reference voltage which varies in accordance with an external voltage; a direct-current amplifying circuit for outputting the above control voltage based on a difference between the above effective voltage and the above reference voltage; and a switching circuit for switching between the output signal of the above variable gain amplifying circuit and the above input signal on the basis of the above reference voltage.

Since the reference voltage generating circuit consists of a resistance dividing circuit and a voltage control switch such as an MOS transistor, only one terminal is sufficient to change the AGC characteristic by correcting the reference voltage and to implement the AGC ON/OFF switching, which facilitates the changing of the reference voltage and the switching of the operation of the automatic gain control device.

Moreover, since the low-pass filter also serves as the holding circuit, the number of components can be reduced, which facilitates the fabrication of the device.

A third automatic gain control device is for attaining the above second object and comprises: a variable gain amplifying circuit for amplifying or attenuating an input signal depending on a gain controlled by a control voltage; a rectifying circuit for rectifying an output signal of the variable gain amplifying circuit and outputting a first rectified voltage; a minute voltage detecting circuit for reversing the voltage level of the input signal of the above variable gain amplifying circuit, while rectifying it, and outputting a second rectified voltage; a clamping circuit for limiting the second rectified voltage outputted from the minute voltage detecting circuit to a given value or lower depending on the value of the above reference voltage; a holding circuit for outputting a peak voltage of the higher one of the first rectified voltage outputted from the above rectifying circuit and the second rectified voltage outputted from the above minute voltage detecting circuit and limited by the above clamping circuit; a reference voltage generating circuit for supplying an appropriate reference voltage; and a direct-current amplifying circuit for outputting the above control voltage based on a difference between the peak voltage outputted from the above holding circuit and the above reference voltage.

Since the clamping circuit varies the value at which the output voltage from the minute voltage detecting circuit is held constant in accordance with the value of the reference voltage, the AGC gain on receiving a minute input signal can be corrected to be 0 dB, thereby implementing the stable AGC characteristic.

Preferably, the third automatic gain control device further comprises a low-pass filter for removing a high-frequency component composed of a direct-current voltage from the above control voltage outputted from the above direct-current amplifying circuit. With the arrangement, since the low-pass filter removes the high-frequency component from the control voltage for controlling the variable gain amplifying circuit, the operation of the variable gain amplifying circuit is stabilized, which further improves the AGC characteristic.

Preferably, in the third automatic gain control device, the above clamping circuit has a direct-current amplifying circuit for amplifying the above reference voltage. With the arrangement, an appropriate clamping voltage can be generated, which further improves the AGC characteristic on receiving a minute input signal.

A fourth automatic gain control device according to the present invention is for attaining the above second object, similarly to the third automatic gain control device, and comprises: a variable gain amplifying circuit for amplifying or attenuating an input signal depending on a gain controlled by a control voltage; a rectifying circuit for rectifying an output signal of the variable gain amplifying circuit and outputting a first rectified voltage; a minute voltage detecting circuit for reversing the voltage level of the input signal of the above variable gain amplifying circuit, while rectifying it, and outputting a second rectified voltage; a clamping circuit for limiting the second rectified voltage outputted from the minute voltage detecting circuit to a given value or lower depending on the value of the above reference voltage; a low-pass filter for outputting an effective voltage of the higher one of the first rectified voltage outputted from the above rectifying circuit and the second rectified voltage outputted from the above minute voltage detecting circuit and limited by the above clamping circuit; a reference voltage generating circuit for supplying an appropriate reference voltage; and a direct-current amplifying circuit for outputting the above control voltage based on a difference between the effective voltage outputted from the above low-pass filter and the above reference voltage.

Since the clamping circuit varies the value at which the output voltage from the minute voltage detecting circuit is held constant in accordance with the value of the reference voltage, the AGC gain on receiving a minute input signal can be corrected to be 0 dB, thereby implementing the stable AGC characteristic.

Moreover, since the low-pas filter also serves as the holding circuit, the number of components can be reduced, which facilitates the fabrication of the device.

Preferably, in the fourth automatic gain control device, the above clamping circuit has a direct-current amplifying circuit for amplifying the above reference voltage. With the arrangement, an appropriate clamping voltage can be generated, which further improves the AGC characteristic on receiving a minute input signal.

A fifth automatic gain control device according to the present invention is for attaining the above third object and comprises: a variable gain amplifying circuit for amplifying or attenuating an input signal depending on a gain controlled by a control voltage; a switching circuit for switching between the input signal and an output signal of the above variable gain amplifying circuit and selectively outputting either one of the input signal and the output signal; a rectifying circuit for rectifying an output signal of the switching circuit; an opening/closing circuit for opening and closing the voltage rectified by the rectifying circuit; a holding circuit for outputting a peak voltage of the above rectified voltage via the opening/closing circuit; an analog-to-digital converting circuit for converting tile above peak voltage to a digital signal; a storage circuit for storing output data from the analog-to-digital converting circuit; a digital-to-analog converting circuit for converting the data read from the storage circuit to an analog signal; and a direct-current amplifying circuit for outputting the control voltage based on a difference between the above peak voltage and an output voltage of the above digital-to-analog converting circuit.

Since the analog-to-digital (A/D) converting circuit digitizes the peak voltage outputted from the holding circuit, the storage circuit stores the digitized peak voltage, and the digital-to-analog (D/A) converting circuit restores the peak voltage, which has been digitized and stored, to a value in analog representation so as to generate the reference voltage, the set value of the reference voltage can be always stored and reproduced, thereby setting the AGC characteristic suitable for an application.

Preferably, the fifth automatic gain control device further comprises a charging circuit for charging the above holding circuit with the output voltage of the above digital-to-analog converting circuit, while the above switching circuit is outputting the input signal. With the arrangement, the above fourth object can be attained. Since the holding circuit is charged by the charging circuit, while the variable gain amplifying circuit is out of operation, the holding circuit is immediately activated as soon as the variable gain amplifying circuit is turned ON and starts operating. Consequently, the AGC ON/OFF switching can be performed at a high speed.

Preferably, the fifth automatic gain control device further comprises a low-pass filter for removing a high-frequency component composed of a direct-current voltage from the control voltage outputted from the above direct-current amplifying circuit. With the arrangement, since the low-pass filter removes the high-frequency component from the control voltage for controlling the variable gain amplifying circuit, the operation of the variable gain amplifying circuit is stabilized, which further improves the AGC characteristic.

Preferably, in the fifth automatic gain control device, the above storage circuit is a nonvolatile memory. With the arrangement, since the stored data is held even when the power source is turned OFF, the reference voltage can be reset with ease.

Moreover, since the memory which has been adopted is nonvolatile, the back-up circuit becomes unnecessary.

Preferably, in the fifth automatic gain control device, the above storage circuit consists of a volatile memory and a backup circuit for holding a content of the volatile memory. With the arrangement, the time required to write data in the storage circuit as well as the time required to read data from the storage circuit can be reduced.

BRIEF DESCRIPTION OF THE DRAWINGS

FIG. 9 is a circuit diagram of an automatic gain control device according to a sixth embodiment of the present invention;

FIGS. 10(a) and 10(b) are views each showing the AGC characteristics of the automatic gain control devices according to the third and fourth embodiments of the present invention, of which FIG. 10(a) is a view showing the relationship between reference voltages Vref and input signal voltages with which the gain becomes 0 dB of the automatic gain control devices according to the third and fourth embodiments of the present invention and FIG. 10(b) is a view showing the relationship between the input signal voltages and output signal voltages, each expressed in a logarithmic value, of the automatic gain control devices according to the third and fourth embodiments of the present invention;

FIGS. 12(a) to 12(c) are views each showing the AGC characteristic of the conventional automatic gain control device, of which FIG. 12(a) is a view showing the relationship between a control voltage Vc and a gain of the conventional automatic gain control device, FIG. 12(b) is a view showing the relationship between a peak voltage Vx and the control voltage Vc of a direct-current amplifying circuit in the case where the reference voltage is held constant, and FIG. 12(c) is a view showing the relationship between the input signal voltage and output signal voltage, each expressed in a logarithmic value, of the conventional automatic gain control device;

FIGS. 14(a) and 14(b) are views each showing the AGC characteristic of the conventional automatic gain control device for voice, of which FIG. 14(a) is a view showing the relationship between the input signal voltage and control voltage Vc of the conventional automatic gain control device for voice and FIG. 14(b) is a view showing the relationship between the input signal voltage and output signal voltage, each expressed in a logarithmic value, of the conventional automatic gain control device for voice.

DETAILED DESCRIPTION OF THE INVENTION

Figure 1:
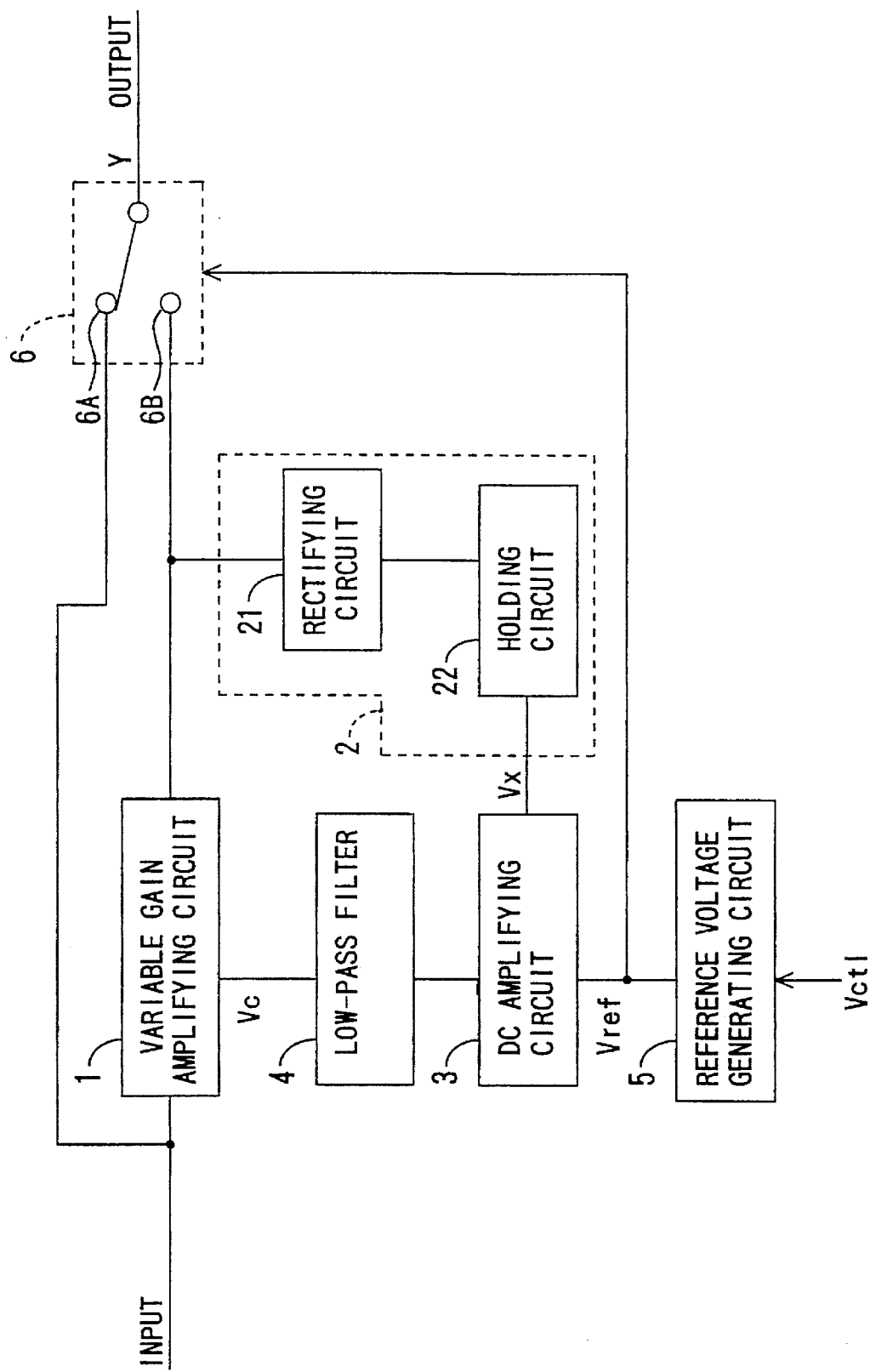
FIG. 1 is a view showing the structure of an automatic gain control device according to a first embodiment of the present invention.
Figure 2:
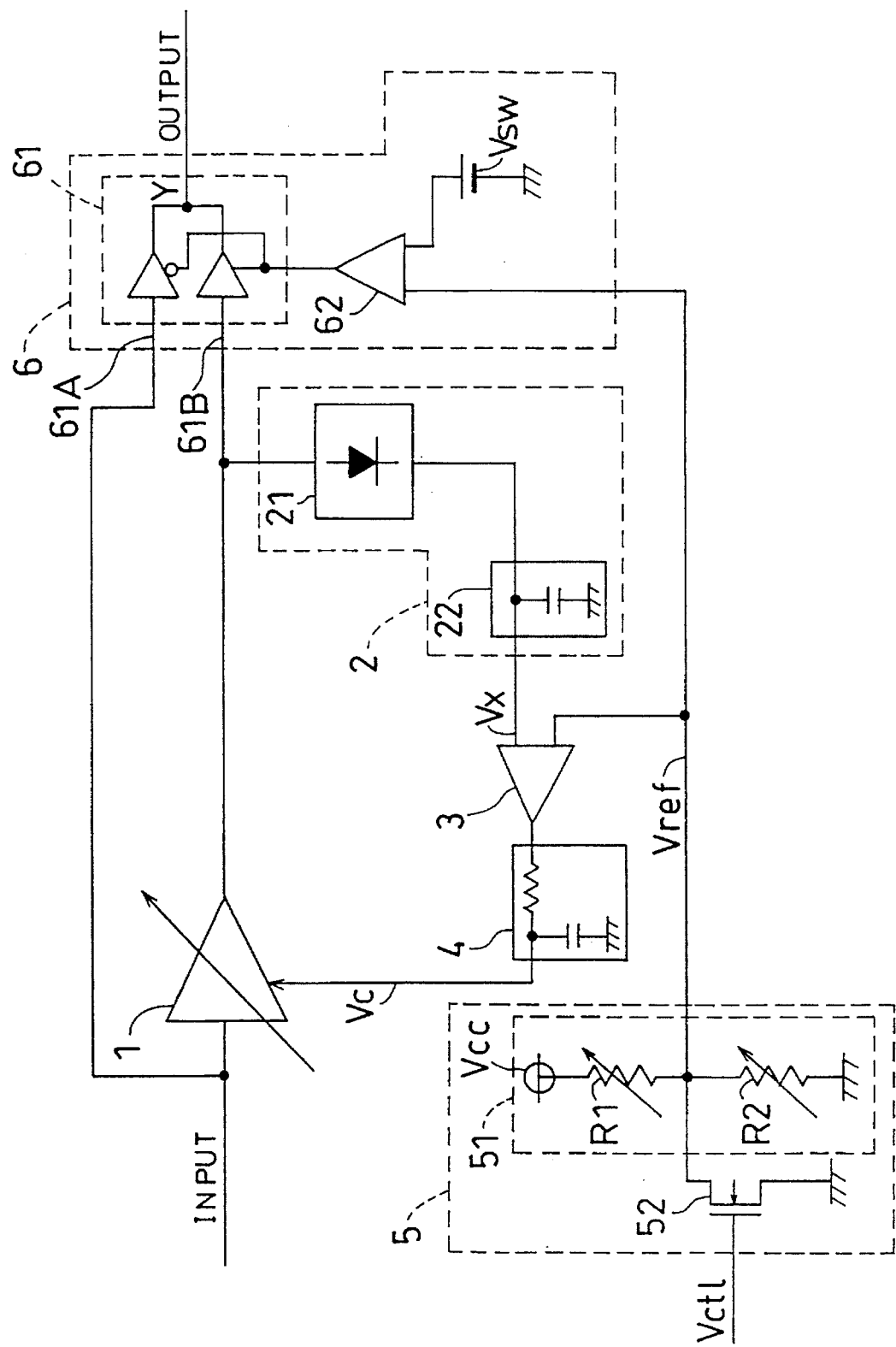
FIG. 2 is a circuit diagram of the automatic gain control device according to the first embodiment of the present invention.
Figure 11:
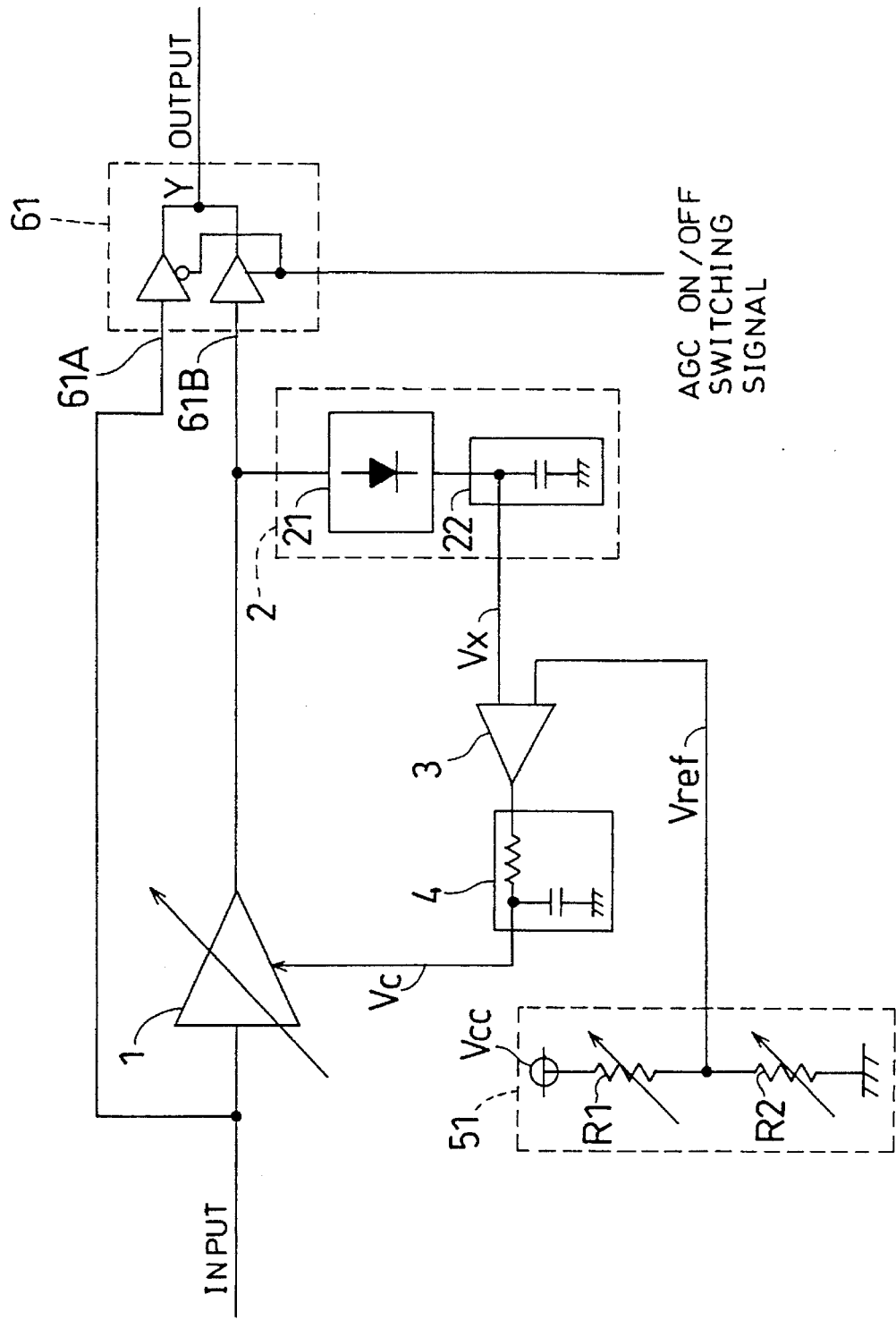
FIG. 11 is a circuit diagram of a conventional automatic gain control device.

Below, a first embodiment of the present invention will be described with reference to the drawings. FIG. 1 is a view showing the structure of an automatic gain control device according the first embodiment of the present invention. FIG. 2 is a circuit diagram of the automatic gain control device according to the first embodiment of the present invention. In FIGS. 1 and 2, the description of the same components as used in the conventional automatic gain control device shown in FIG. 11 will be omitted by providing the same reference numerals. In FIGS. 1 and 2 are shown: a reference voltage generating circuit 5 for generating a reference voltage Vref, which is compared with the peak voltage Vx such that the control voltage Vc is generated based on a difference therebetween; a switching circuit 6 for switching between the state in which the input signal passes through the variable gain amplifying circuit 1 and the state in which the input signal does not pass through the variable gain amplifying circuit; and an external voltage Vct1 applied to the reference voltage generating circuit 5 so as to control the switching circuit 6. In FIG. 2 are shown: an N-channel MOS transistor for controlling the switching circuit 6; and a voltage comparator circuit 62 controlled by the reference voltage Vref generated from the reference voltage generating circuit 5 and by a switching voltage Vsw from the switching circuit 6 so as to output a High voltage if the reference voltage Vref is higher than the switching voltage Vsw and to output a Low voltage in the other cases.

The first embodiment shown in FIG. 1 is characterized in that the changing of the AGC characteristic by making the reference voltage Vref variable and the AGC ON/OFF switching can be performed by means of a single external terminal.

Below, a description will be given to the switching operation in the automatic gain control device thus constituted.

As the external voltage Vct1 for performing the AGC ON/OFF switching, the High voltage or Low voltage is digitally inputted to the reference voltage generating circuit under the control of, e.g., a microcomputer outside the automatic gain control device.

If the external voltage Vct1 is Low, the N-channel MOS transistor 52 is cut off, so that the value of the reference voltage Vref can be obtained from the following equation:

$$Vref = Vcc \times R2/(R1+R2).$$

Consequently, the reference voltage Vref can be varied by varying the value of the first resistor R1 or of the second resistor R2. On the other hand, the voltage comparator circuit 62 compares the reference voltage Vref with the switching voltage Vsw, sets the reference voltage Vref such that it becomes higher than the switching voltage Vsw, and outputs the High voltage. Consequently, the input terminal 61B of the switching buffer circuit with a control terminal 61 is selected, so that an output signal is generated from the automatic gain control device.

If the external voltage Vct1 is High, the N-channel MOS transistor is brought into conduction and the reference voltage Vref becomes lower than the switching voltage Vsw, so that the voltage comparator circuit 62 outputs the Low voltage. Consequently, the input terminal 61A of the switching buffer circuit with a control terminal 61 is selected, so that the input signal is outputted directly from the output terminal of the switching buffer circuit with a control terminal 61.

The present embodiment is characterized in that it uses only one terminal to set the AGC characteristic by controlling the reference voltage Vref and to implement the AGC ON/OFF switching function. When the present automatic gain control device is mounted on an IC chip, it is sufficient to use the external voltage Vct1 or the reference voltage Vref as an external terminal.

Since the reference voltage generating circuit 5 is so constituted as to control the voltage comparator circuit 62 in order to enable switching between a voltage equal to or lower than the switching voltage Vsw and a direct-current voltage equal to or higher than the switching voltage Vsw, equal effects can be achieved using the method in which, e.g., a D/A converting circuit is controlled by a microcomputer, one of a plurality of direct-current voltage lines is selected from within by means of a switch so as to supply the reference voltage Vref to the reference voltage generating circuit 5, or the N-channel MOS transistor 52 is replaced by an NPN bipolar transistor or by an electromagnetic relay. Although the foregoing description has been given on the assumption that the variable gain amplifying circuit 1 is turned OFF when the reference voltage Vref is lower than the switching voltage Vsw, it will be appreciated that, when the reference voltage Vref is higher than the switching voltage Vsw, the variable gain amplifying circuit 1 can be turned OFF by varying the combination of the polarities of the N-channel MOS transistor 52, voltage comparator circuit 62, and switching buffer circuit with a control terminal 61.

Figure 3:
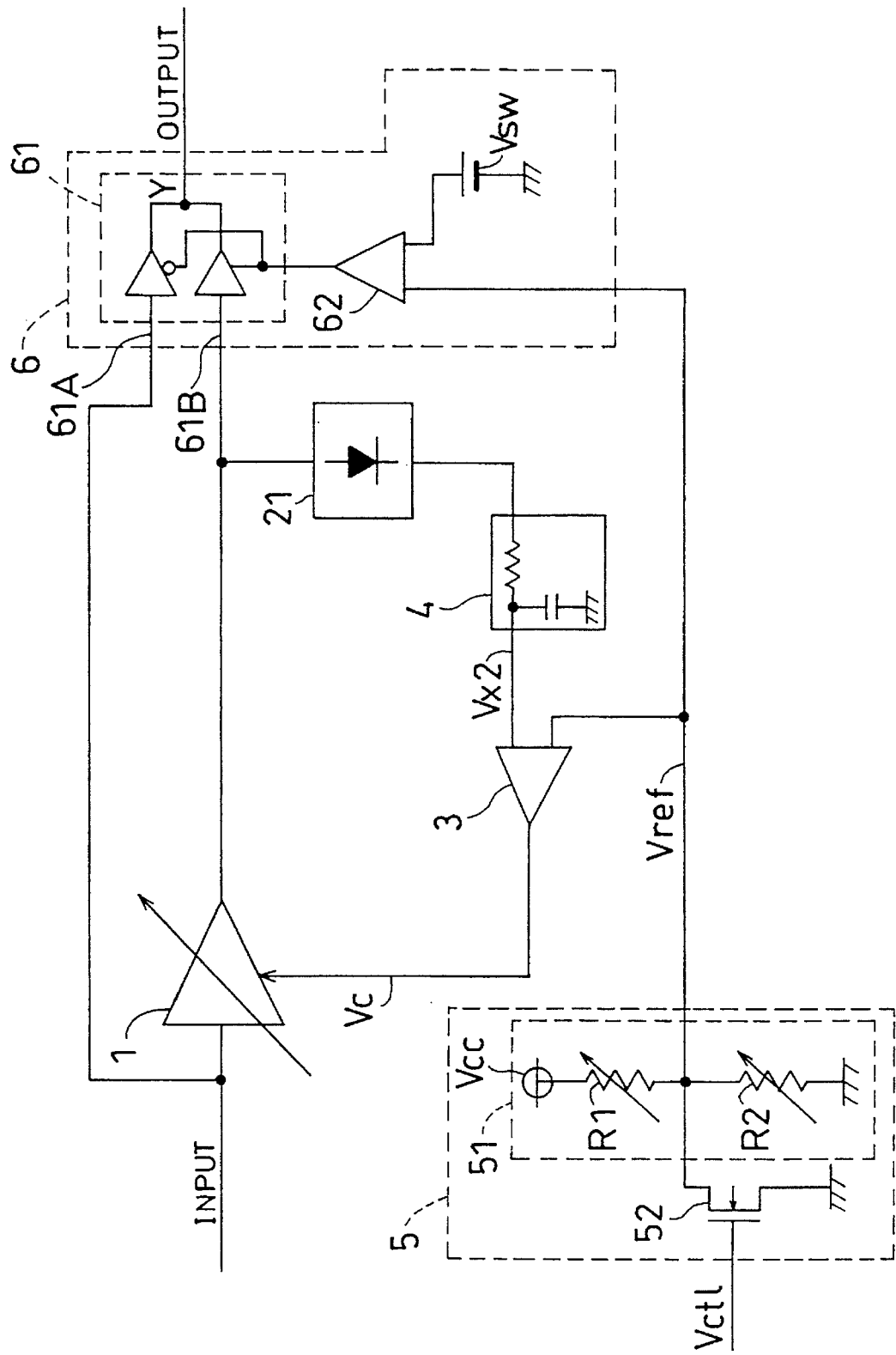
FIG. 3 is a circuit diagram of an automatic gain control device according to a second embodiment of the present invention.

Below, a second embodiment of the present invention will be described with reference to the drawings. FIG. 3 is a circuit diagram of an automatic gain control device according the second embodiment of the present invention. In FIG. 3, the description of the same components as used in the automatic gain control device according to the first embodiment shown in FIG. 2 will be omitted by providing the same reference numerals. In FIG. 3, the low-pass filter 4 is connected in series between the rectifying circuit 21 and the direct-current amplifying circuit 3 so as to receive the rectified voltage outputted from the rectifying circuit 21 and to output an effective voltage Vx2 of the rectified voltage received. The direct-current amplifying circuit 8 amplifies a difference between the reference voltage Vref from the reference voltage generating circuit 5 and the effective voltage Vx2 so as to generate a control voltage Vc. It is also possible to additionally provide the variable gain amplifying circuit, the rectifying circuit 2, the low-pass filter 4, and the switching circuit 6 in the present embodiment such that the highest one of the effective voltages Vx2 of multiple inputs or a mean value thereof is inputted to the direct-current amplifying circuit 4, thereby controlling the plurality of variable gain amplifying circuits 1.

The present embodiment is characterized in that it uses only one terminal to set the AGC characteristic by controlling the reference voltage Vref and to implement the AGC ON/OFF switching function, similarly to the first embodiment.

Moreover, since the low-pass filter 4 also functions as the holding circuit 22, the device structure is simplified.

Figure 4:
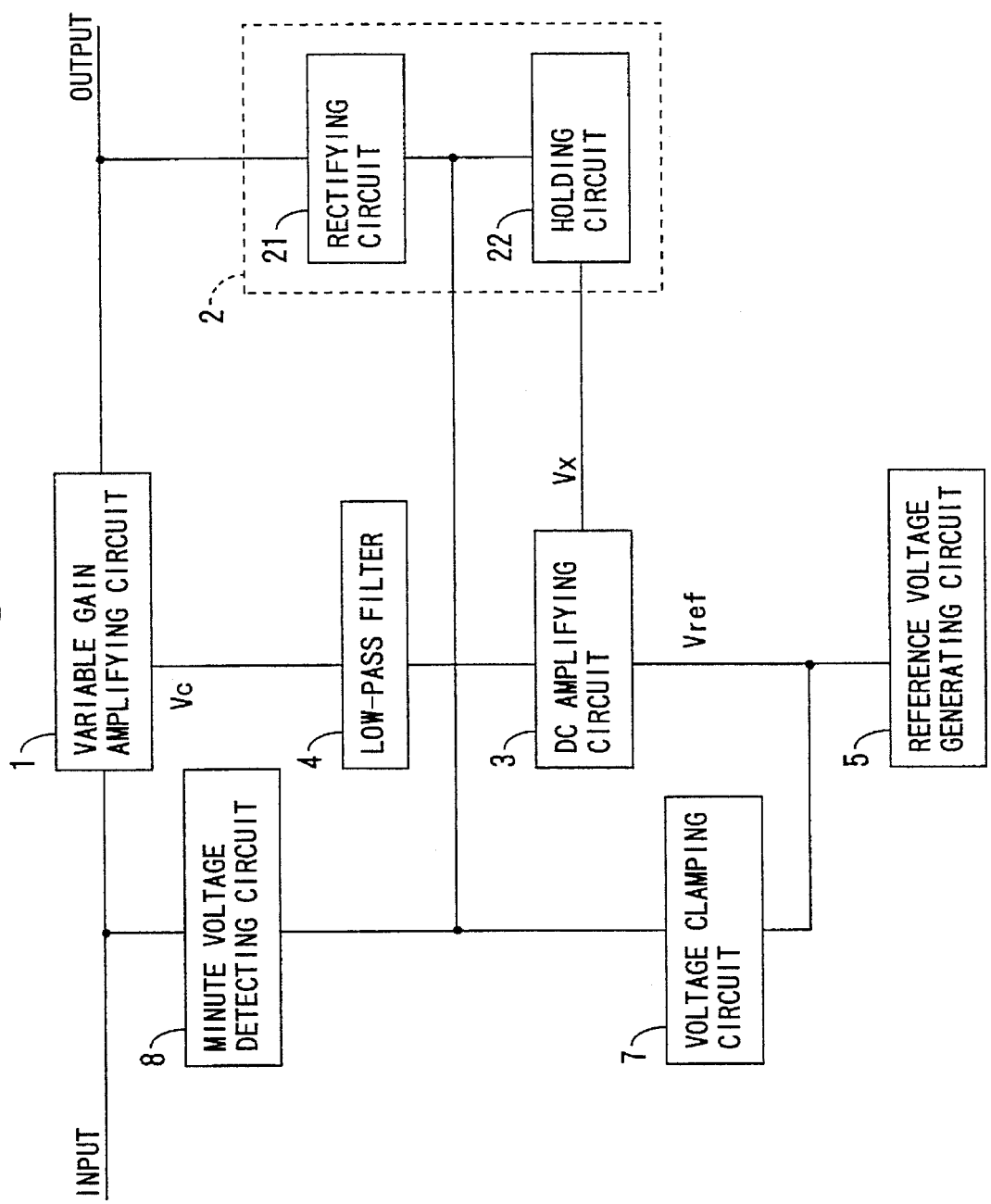
FIG. 4 is a view showing the structure of an automatic gain control device according to a third embodiment of the present invention.
Figure 5:
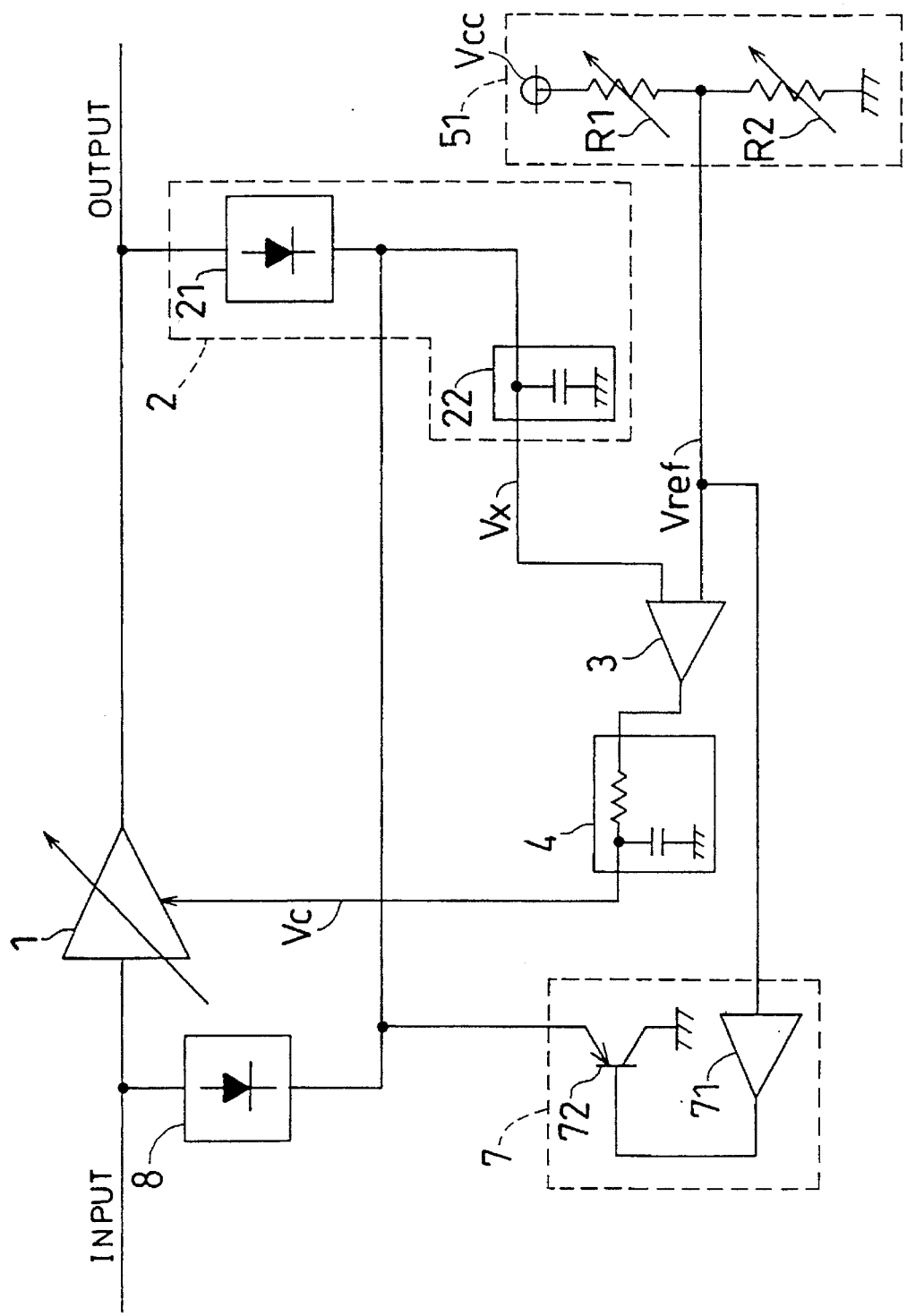
FIG. 5 is a circuit diagram of the automatic gain control device according to the third embodiment of the present invention.
Figure 12A:
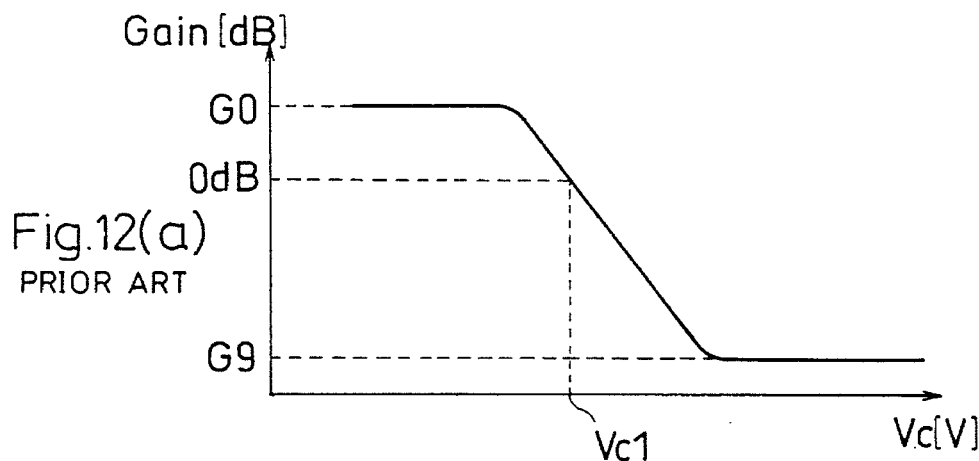
Figure 12B:
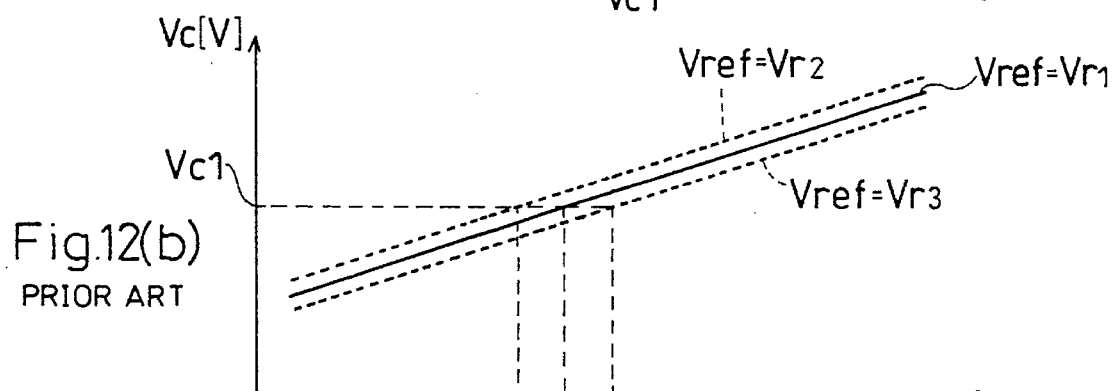
Figure 12C:
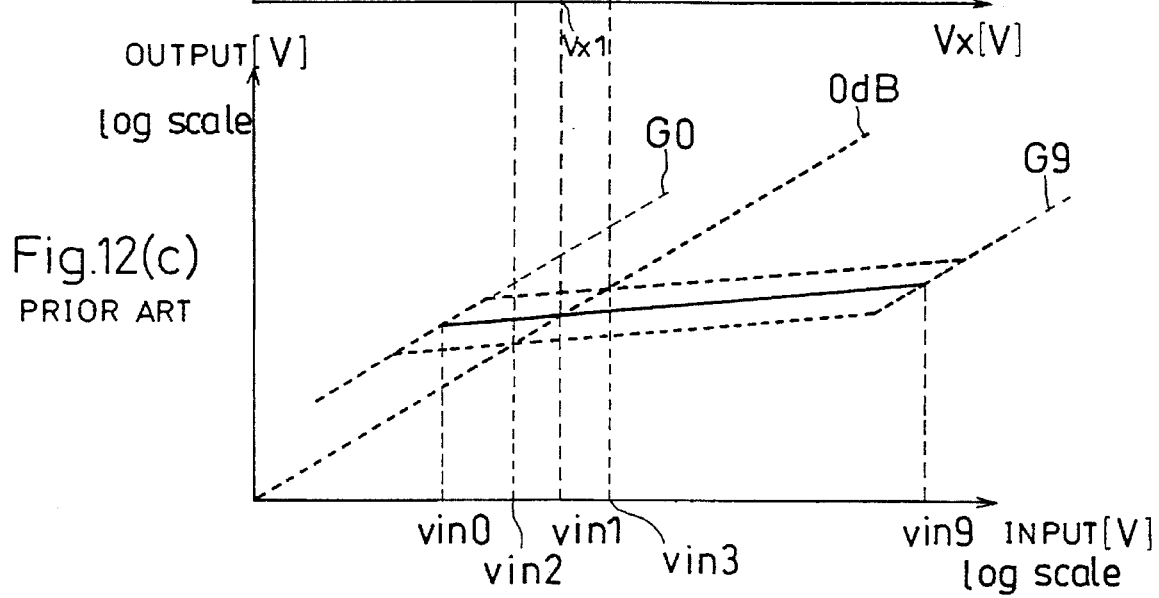
Figure 13:
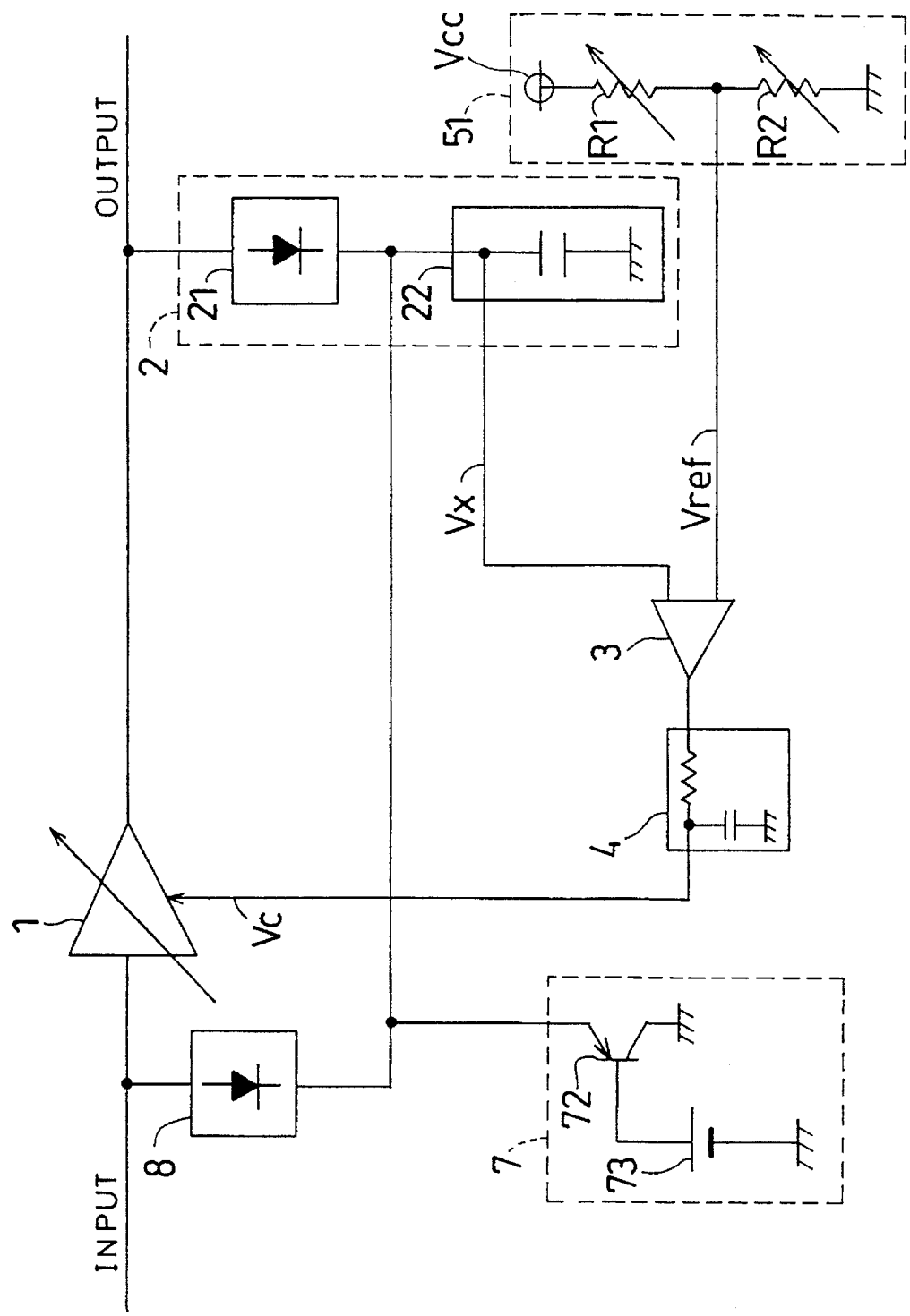
FIG. 13 is a circuit diagram of a conventional automatic gain control device for voice.

Below, a third embodiment of the present invention will be described with reference to the drawings. FIG. 4 is a view showing the structure of an automatic gain control device according to a third embodiment of the present invention. FIG. 5 is a circuit diagram of the automatic gain control device according to the third embodiment of the present invention. In FIGS. 4 and 5, the description of the same components as used in the conventional automatic gain control device shown in FIG. 13 will be omitted by providing the same reference numerals. In FIG. 4, since the variable gain amplifying circuit 1 has the gain characteristic of FIG. 12(a), if the input signal is a minute voltage, the output from the peak detecting circuit 2 is lowered, as indicated by the characteristic of L1 in FIG. 14(a). As indicated by the characteristic of L2 in FIG. 14(a), the voltage outputted from the minute voltage detecting circuit 8 becomes higher as the input signal voltage becomes increasingly lower than a given voltage. The output voltage of the minute voltage detecting circuit 8 is coupled to the output voltage of the rectifying circuit 21 and the higher one of the above two output voltages serves as the peak voltage Vx, which is the output voltage of the holding circuit 22. As the peak voltage Vx becomes higher, the control voltage Vc via the direct-current voltage circuit 3 and the low-pass filter 4 becomes higher, which lowers the gain of the variable gain amplifying circuit 1. To prevent an excessive reduction in gain equal to or lower than a given input level, the output voltage of the minute voltage detecting circuit 8 is limited by the clamping circuit 7, as indicated by the characteristic of L3 in FIG. 14(a). If the AGC characteristic is changed by varying the reference voltage Vref, the clamping voltage of the clamping circuit 7 varies in accordance with the reference voltage Vref, so that the minimum gain on receiving a fixed minute input signal can be corrected to be constant depending on variations in the reference voltage Vref.

The third embodiment shown in FIG. 4 is characterized in that the minute voltage detecting circuit 8 and the clamping circuit 7 are provided in order to prevent the deterioration of an S/N ratio resulting from an increase in the gain of the AGC characteristic on receiving a minute input signal, thereby reducing the gain of the AGC characteristic.

Moreover, since the AGC characteristic is changed by varying the reference voltage Vref so as to vary the clamping voltage in accordance with the reference voltage Vref, the minimum gain of the AGC characteristic on receiving the minute input signal can be corrected to be constant.

In FIG. 5, a reference numeral 71 designates a direct-current amplifying circuit for clamping which amplifies the reference voltage Vref so as to generate a voltage for clamping. The clamping circuit 7 consists of the direct-current amplifying circuit 71 for clamping to which the reference voltage Vref is inputted and a PNP transistor 72 having a base electrode to which the reference voltage Vref is applied.

Figure 10A:
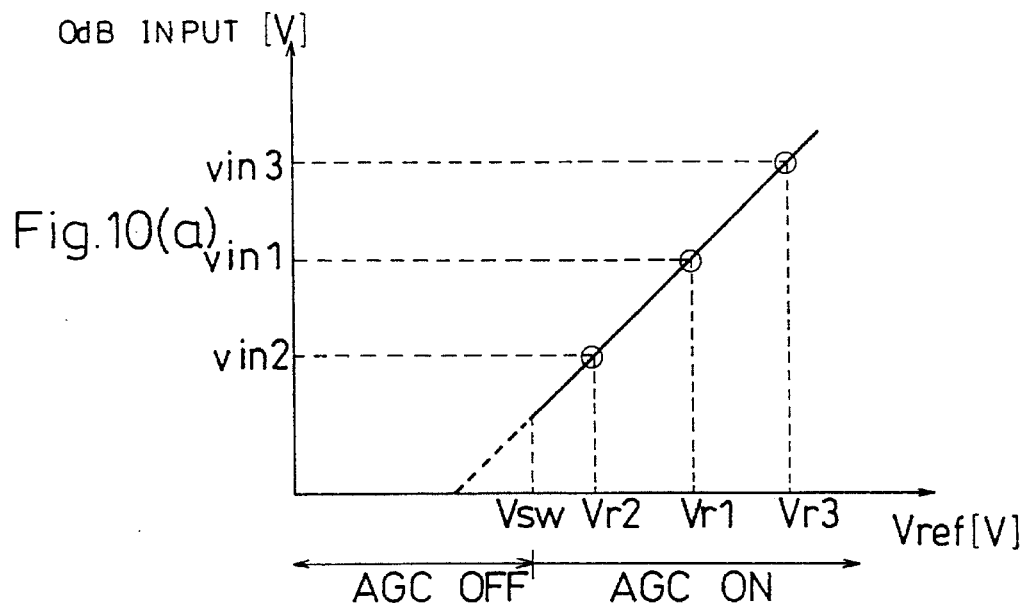
Figure 10B:
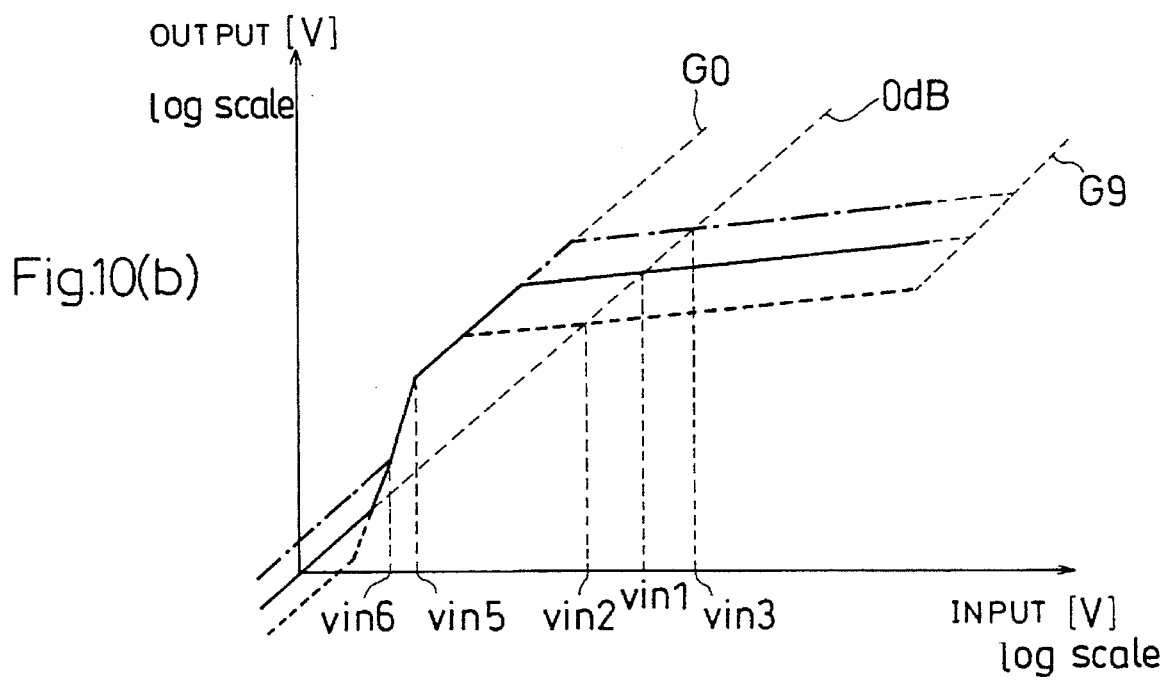

Below, a description will be given to the operation of the automatic gain control device thus constituted with reference to the drawings. FIGS. 10(a) and 10(b) are views showing the AGC characteristic of the automatic gain control device according to the third embodiment of the present invention. FIG. 10(a) is a view showing the relationship between the reference voltage Vref and the voltage of the input signal with which the gain becomes 0 dB of the automatic gain control device according to the third embodiment of the present invention. FIG. 10(b) is a view showing the relationship between the voltage of the input signal and the voltage of the output signal of the automatic gain control device according to the third embodiment. In FIG. 10(a) are shown: the standard value Vr1 of the reference voltage; the value Vr2 of the reference voltage which is lower than the standard value; the value Vr3 of the reference voltage which is higher than the standard value; the value vin1 of the input signal voltage with which the gain becomes 0 dB when the value of the reference voltage is Vr1; the value vin2 of the input signal voltage with which the gain becomes 0 dB when the value of the reference voltage is Vr2; the value vin3 of the input signal voltage with which the gain becomes 0 dB when the value of the reference voltage is Vr3. In FIG. 10(b), vin1, vin2, and vin3 are the same as mentioned above. In FIG. 10(b) are also shown: a value vin5 of the input signal voltage with which the output voltage of the minute voltage detecting circuit 8 becomes equal to the output voltage of the rectifying circuit 21; a value vin6 of the input signal voltage with which the output voltage of the minute voltage detecting circuit 8 becomes equal to the output voltage of the clamping circuit 7; the maximum gain G0; and the minimum gain G9.

When the reference voltage Vref has the standard value Vr1, the output voltage from the rectifying circuit 21 with respect to an input signal voltage higher than the value vin5 becomes higher than the output voltage from the minute voltage detecting circuit 8. The output voltage of the rectifying circuit 21 is outputted by means of an emitter follower and coupled to the minute voltage detecting circuit 8, while the output voltage from the minute voltage detecting circuit 8 is low, so that its output transistor is cut off, thereby outputting the output voltage of the rectifying circuit 21, which is high, as the peak voltage Vx via the holding circuit 22.

Figure 14A:
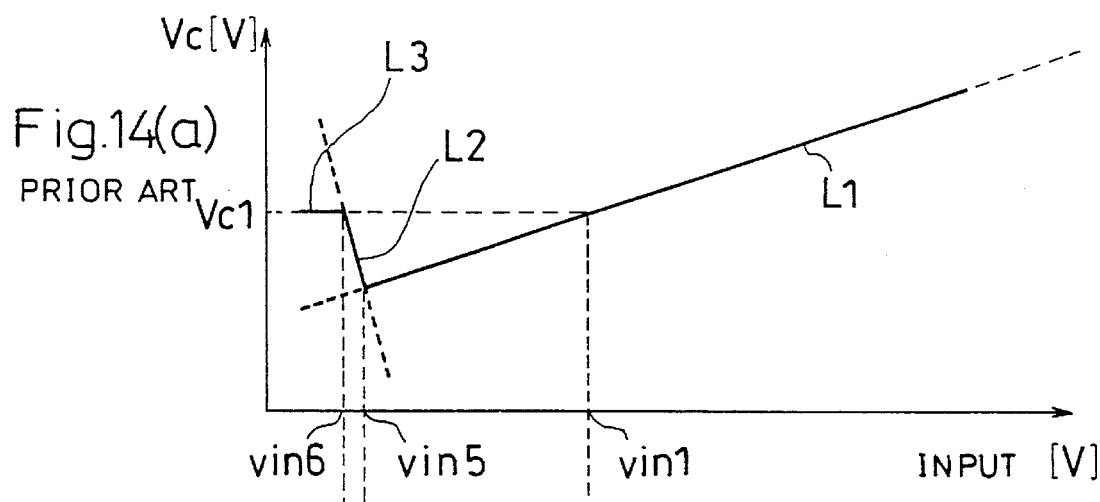
Figure 14B:
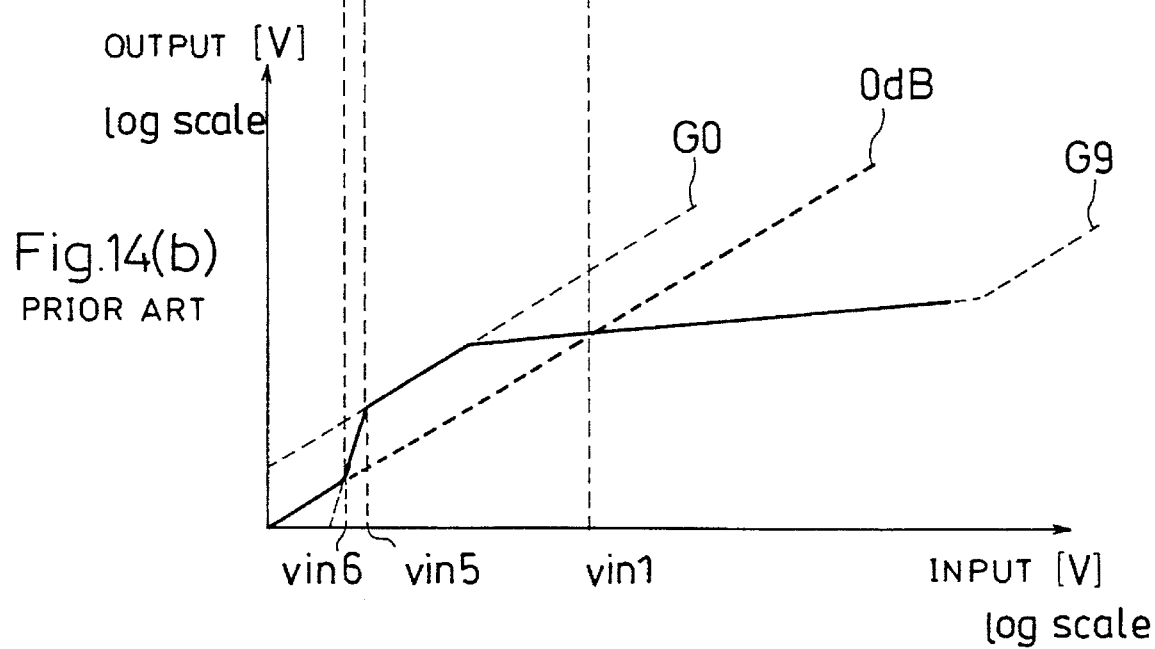

With respect to an input signal voltage lower than the value vin5 shown in FIG. 14(a), the output from the minute voltage detecting circuit 8 becomes higher in voltage than the output from the rectifying circuit 21, so that it is outputted as the peak voltage Vx via the holding circuit 22. Accordingly, the output voltage of the minute voltage detecting circuit 8 becomes higher with a reduction in input signal voltage. As a result, tile peak voltage Vx and the control voltage Vc are increased, so that the gain is attenuated as shown in FIG. 14(b). When the output voltage of the clamping circuit 7 is added to tile output voltage of the minute voltage detecting circuit 8, an excessive output voltage of the minute voltage detecting circuit 8 is clamped on the output voltage of the clamping circuit 7. Consequently, if the input signal voltage is lower than the value vin6 shown in FIG. 14(a), the gain becomes 0 dB even when a minute signal voltage is inputted, so that the constant AGC characteristic is obtained irrespective of the amplitude of the input signal.

In the case where the reference voltage Vref is set to Vr3 higher than the standard value shown in FIG. 10(a), if the input signal voltage is vin1, the control voltage Vc via the direct-current amplifying circuit 3 and low-pass filter 4 becomes low, resulting in an increase in the gain of the AGC characteristic. However, if the clamping voltage is equal in value to the above clamping voltage, the gain on receiving a minute input voltage is also increased. To prevent the phenomenon, the clamping voltage is set to a value higher than the value in the case where the reference voltage is Vr1 via the direct-current amplifying circuit 71 for clamping which uses the reference voltage Vref as an input value and the PNP bipolar transistor 72, thereby holding the minimum gain on receiving a minute input signal equal to or lower than the given value vin6 to 0 dB, similarly to the case where the reference voltage is Vr1.

In the case of setting the reference voltage Vref to Vr2, which is lower than the standard value, if the input signal voltage is vin1, the control voltage Vc via the direct-current amplifying circuit 3 and low-pass filter 4 becomes high, resulting in a reduction in the gain of the AGC characteristic. However, if the clamping voltage is equal in value to the above clamping voltage, the gain on receiving a minute voltage is also reduced. Consequently, the minimum gain can be held at 0 dB by setting the clamping voltage at a value lower than the standard value Vr1 of the reference voltage, similarly to the case of using the standard reference voltage.

By additionally providing the variable gain amplifying circuit 1 and the peak detecting circuit 2, the highest one of the peak voltages Vx of multiple inputs or a mean value thereof is inputted to the direct-current amplifying circuit 3, thereby controlling the plurality of variable gain amplifying circuits 1.

Figure 6:
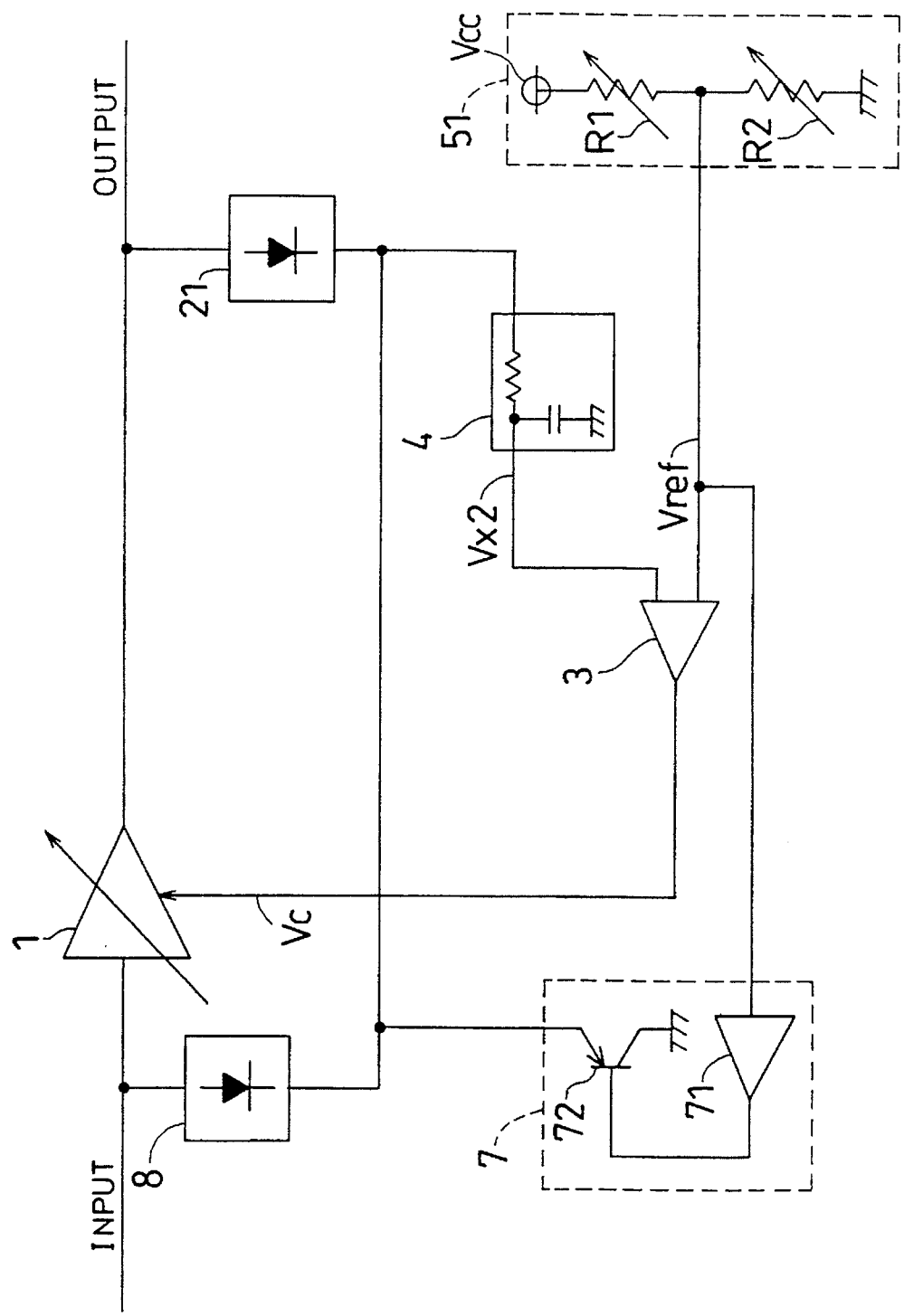
FIG. 6 is a circuit diagram of an automatic gain control device according to a fourth embodiment of the present invention.

Below, a fourth embodiment of the present invention will be described with reference to the drawings. FIG. 6 is a circuit diagram of the automatic gain control device according to the fourth embodiment of tile present invention. In FIG. 6, the description of the same components as used in the automatic gain control device according to the third embodiment of the present invention shown in FIG. 5 will be omitted by providing the same reference numerals. In FIG. 6, a description will be given only to portions different from the third embodiment. In the drawing, the low-pass filter 4 is connected in series between the rectifying circuit 21 and the direct-current amplifying circuit 3 so as to receive the rectified voltage outputted from the rectifying circuit 21 and to output the effective voltage Vx2 of the rectified voltage received, similarly to the second embodiment. The direct-current amplifying circuit 3 is so constituted as to perform direct-current amplification with respect to the difference between the effective voltage Vx2 and the reference voltage Vref, thereby generating the control voltage Vc.

The present embodiment is characterized in that, since the clamping voltage varies as the reference voltage Vref varies, the minimum gain on receiving a minute input signal equal to or lower than a given value can be held at a constant value.

Moreover, since the low-pass filter 4 also functions as the holding circuit 22, the device structure is simplified.

By additionally providing the variable gain amplifying circuit 1, rectifying circuit 21, low-pass filter 4, and switching circuit 6, the highest one of the effective voltages Vx2 of multiple inputs or a mean value thereof is inputted to the direct-current amplifying circuit 3, thereby controlling the plurality of variable gain amplifying circuits 1.

Figure 7:
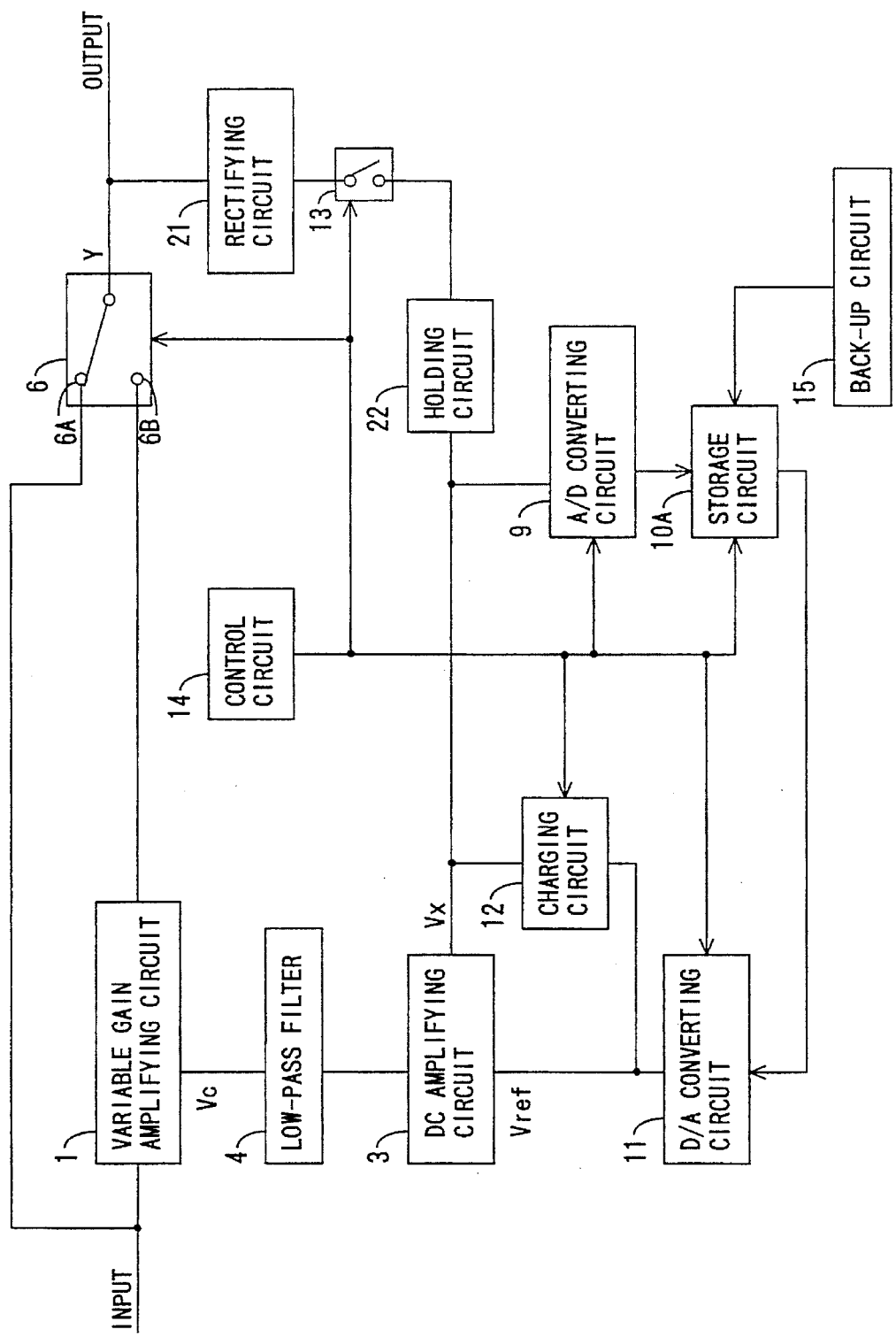
FIG. 7 is a view showing the structure of an automatic gain control device according to a fifth embodiment of the present invention.
Figure 8:
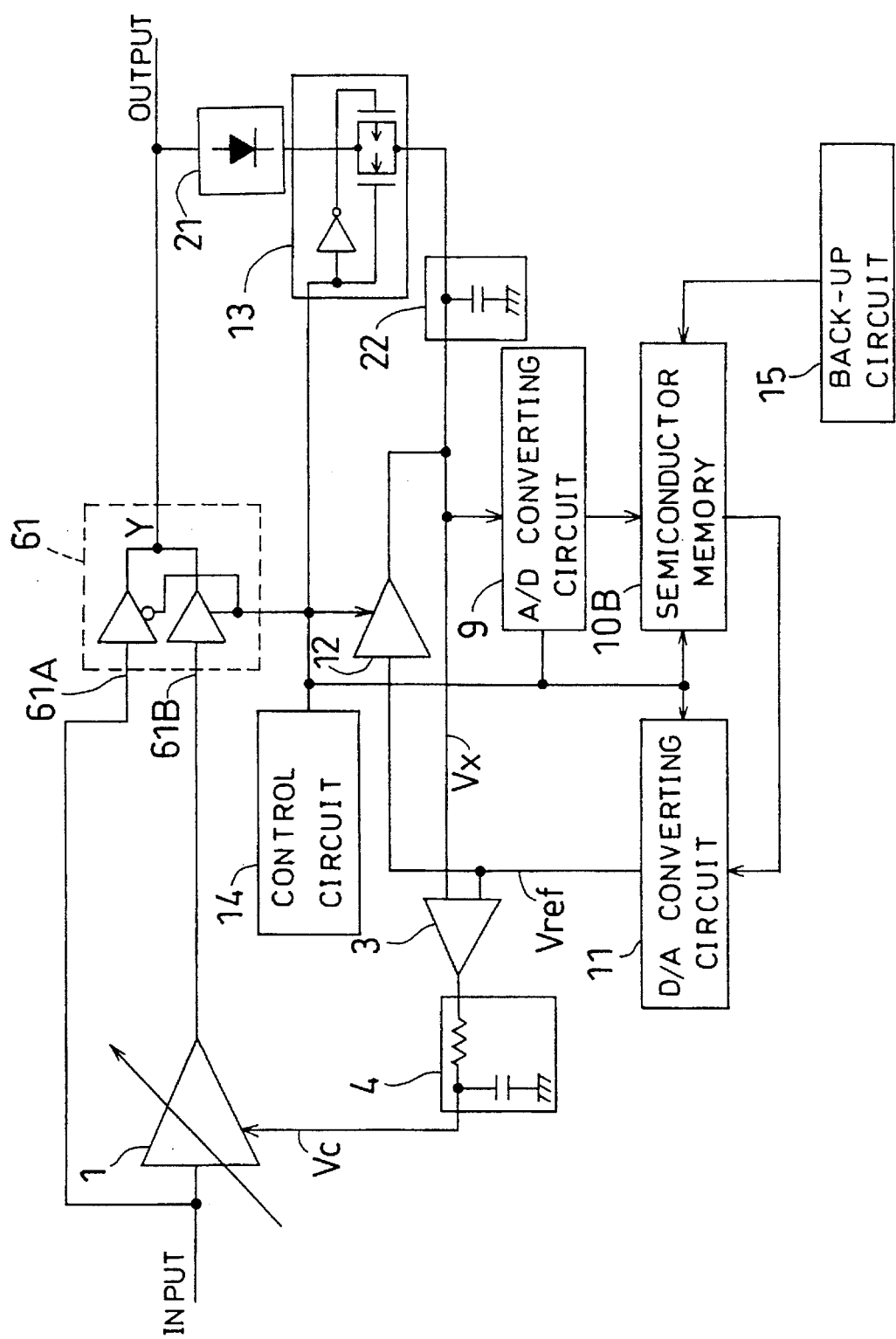
FIG. 8 is a circuit diagram of the automatic gain control device according to the fifth embodiment of the present invention.

Below, a fifth embodiment of the present invention will be described with reference to the drawings. FIG. 7 is a view showing the structure of an automatic gain control device according to the fifth embodiment of the present invention. FIG. 8 is a circuit diagram of the automatic gain control device according to the fifth embodiment of the present invention. In FIGS. 7 and 8, a description will be given only to components newly added to the automatic gain control device according to the first embodiment of the present invention. In FIGS. 7 and 8 are shown: an A/D converting circuit 9 for digitizing the peak voltage Vx outputted from the holding circuit 22; a storage circuit for 10A for storing the peak voltage Vx which has been digitized by the A/D converting circuit 9; a semiconductor memory 10B such as an SRAM; a D/A converting circuit 11 for restoring the digitized peak voltage Vx stored in the storage circuit 10A to the reference voltage Vref; a charging circuit 12 for charging the capacitance of the holding circuit 22; an opening/closing circuit 13 for opening and closing the holding circuit 22; a control circuit 14 for controlling the A/D converting circuit 9, storage circuit 10A, D/A converting circuit 11, charging circuit 12, opening/closing circuit 13, and switching circuit 6; and a back-up circuit 15 for the storage circuit such as an SRAM, which requires a backup power source. In the case of using a nonvolatile memory such as an EEPROM as the semiconductor memory 10B, the back-up circuit 15 becomes unnecessary.

Below, a description will be given to the operation of the automatic gain control device thus constituted.

If it is assumed that the input terminal 6A of the switching circuit 6 has been selected by the control circuit 14 and the opening/closing circuit 13 is closed at first, the peak voltage Vx is generated from the input signal via the rectifying circuit 21 and holding circuit 22 and digitized by the A/D converting circuit. As a result, digitized data Vx is stored in the storage circuit 10A comprising the back-up circuit 15.

Next, the data Vx in the storage circuit 10A is restored by the D/A converting circuit 11 and the restored voltage is inputted as the reference voltage Vref to the direct-current amplifying circuit 4. A sufficiently large number of bits are provided such that the input voltage Vx of the A/D converting circuit 9 and the output voltage Vref of the D/A converting circuit 11 are constantly equal to each other and that a quantizing error of the A/D converting circuit 9 can be ignored.

Next, the input terminal 6B of the switching circuit 6 is selected by the control circuit 14, so that the input signal is inputted to the direct-current amplifying circuit 3 via the variable gain amplifying circuit 1, rectifying circuit 21, and holding circuit 22. If a certain relationship has been previously established among the peak voltage Vx, the reference voltages Vref, and the control voltage Vc or the gain of the variable gain amplifying circuit 1 whereby the gain of the variable gain amplifying circuit 1 with respect to the control voltage Vc becomes 0 dB when the peak voltage Vx is equal to the reference voltage Vref, the gain converges to 0 dB due to the performance characteristic of AGC. Although the relationship among the gain of the variable gain amplifying circuit 1, the peak voltage Vx, and the reference voltage Vref has been assumed such that the gain of the variable amplifying circuit 1 with respect to the control voltage Vc becomes 0 dB when the peak voltage Vx is equal to the reference voltage Vref, if it has been arranged that the gain of the variable gain amplifying circuit 1 becomes N dB (N designates a given real number), the AGC characteristic having the gain of N dB with the same standard input signal can be implemented by using the same procedure as described above.

Consequently, it becomes possible to store the reference voltage Vref, while it becomes possible to set the AGC characteristic with respect to an arbitrary input signal.

Next, the input terminal 6A of the switching circuit 6 is selected by the control circuit 14, which opens the opening/closing circuit 13 and brings about an AGC OFF state, while the capacitance of tile holding circuit 22 is charged via the charging circuit 12 so as to equalize the peak voltage Vx and the reference voltage Vref. As soon as the switching circuit 6 shifts from the OFF state to the ON state, the output from the charging circuit 12 is brought into a high impedance state by the control circuit 14, while the closing/opening circuit 13 is closed, so that the peak voltage Vx is generated again by the rectifying circuit 21 and the present device is driven by the resulting peak voltage Vx.

Since the time required to charge the holding circuit 22 via the rectifying circuit 21 can be omitted on switching from the AGC OFF state to an AGC ON state, stable and high-speed switching can be momentarily performed in the automatic gain control device. Since the charging of the holding circuit 22, which accounts for a major part of the switching time, has been previously completed, the rise time till the AGC characteristic is stabilized can be reduced, thereby implementing high-speed switching from the AGC OFF state to the AGC ON state. Since the switching from the AGC ON state to the AGC OFF state can be performed at a sufficiently high speed, no measure is required.

Below, a sixth embodiment of the present invention will be described with reference to the drawings. FIG. 9 is a circuit diagram of an automatic gain control device according to the sixth embodiment of the present invention. In FIG. 9, a description will be given only to components newly added to the automatic gain control device according to the fifth embodiment of the present invention shown in FIG. 8. In FIG. 9 are shown: a reference voltage generating circuit 16 for setting a gain to be used as a standard; and a second control voltage Vref2 for setting the standard gain. The switching buffer circuit with a control terminal 61 is so constituted as to receive the second control voltage Vref2, which is an output voltage of the reference voltage generating circuit 16, and the control voltage Vc, which is the output voltage of the low-pass filter. On the other hand, the variable gain amplifying circuit 1 is so constituted as to receive either one of the second control voltage Vref2 and the control voltage Vc.

Below, a description will be given to the operation of the automatic gain control device thus constituted.

Initially, an input terminal 61A of the switching buffer circuit 61 is selected and the gain of the variable gain control circuit 1 is set to 0 dB by the second control voltage Vref2.

Next, a standard input signal for setting the AGC characteristic to 0 dB is inputted so that the peak voltage Vx via the rectifying circuit 21 and holding circuit 22 is converted to data Vx by the A/D converting circuit 9, which is stored in the semiconductor memory 10 B.

Next, the data Vx is read out and the reference voltage Vref is generated by the D/A converting circuit 11. It is necessary to provide a sufficiently long data length such that the peak voltage Vx and the reference voltage Vref are constantly equal to each other and that the quantizing error accompanying digitization is sufficiently reduced.

Next, when the input terminal 61B of the switching buffer circuit with a control terminal 61 is selected and the above standard input signal is inputted, the peak voltage Vx via the rectifying circuit 21 and holding circuit 22 converges to a voltage equal to the reference voltage Vref in accordance with the performance characteristic of AGC, since the peak voltage Vx and the reference voltage Vref are equal to each other and since a certain relationship has been established between the control voltage Vc and the gain such that the gain of the variable gain control circuit 1 becomes 0 dB. It is also possible, when a semiconductor memory 10B having a large storage capacity is used, to set a plurality of standard signals so as to change the control characteristic of the AGC gain by reading any one from the standard signals at an appropriate time.

The present embodiment is characterized in that it becomes possible to store the reference voltage Vref and to set the AGC characteristic with respect to an arbitrary input signal.

Since the reference voltage generating circuit 16 has a smaller number of elements than the opening/closing circuit 13, the resulting device has a simplified structure.

We claim:

1. An automatic gain control device comprising:
   a variable gain amplifying circuit for amplifying or attenuating an input signal depending on a gain controlled by a control voltage;
   a rectifying circuit for rectifying an output signal of the variable gain amplifying circuit;
   a holding circuit for outputting a peak voltage of the voltage rectified by said rectifying circuit;
   a reference voltage generating circuit for outputting a reference voltage which varies in accordance with an external voltage;
   a direct-current amplifying circuit for outputting said control voltage based on a difference between said peak voltage and said reference voltage; and
   a switching circuit for switching between the output signal of said variable gain amplifying circuit and said input signal on the basis of said reference voltage.

2. An automatic gain control device according to claim 1, further comprising:
   a low-pass filter for removing a high-frequency component composed of a direct-current voltage from said control voltage outputted from said direct-current amplifying circuit.

3. An automatic gain control device comprising:
   a variable gain amplifying circuit for amplifying or attenuating an input signal depending on a gain controlled by a control voltage;
   a rectifying circuit for rectifying an output signal of said variable gain amplifying circuit;
   a low-pass filter for outputting an effective voltage of the voltage rectified by said rectifying circuit;
   a reference voltage generating circuit for outputting a reference voltage which varies in accordance with an external voltage;
   a direct-current amplifying circuit for outputting said control voltage based on a difference between said effective voltage and said reference voltage; and
   a switching circuit for switching between the output signal of said variable gain amplifying circuit and said input signal on the basis of said reference voltage.

4. An automatic gain control device comprising:
   a variable gain amplifying circuit for amplifying or attenuating an input signal depending on a gain controlled by a control voltage;
   a rectifying circuit for rectifying an output signal of said variable gain amplifying circuit and outputting a first rectified voltage;
   a minute voltage detecting circuit for reversing the voltage level of the input signal of said variable gain amplifying circuit, while rectifying it, and outputting a second rectified voltage;
   a reference voltage generating circuit for supplying an appropriate reference voltage;
   a clamping circuit for limiting the second rectified voltage outputted from said minute voltage detecting circuit to a given value or lower depending on the value of said reference voltage;
   a holding circuit for outputting a peak voltage of the higher one of the first rectified voltage outputted from said rectifying circuit and the second rectified voltage outputted from said minute voltage detecting circuit and limited by said clamping circuit;
   a direct-current amplifying circuit for outputting said control voltage based on a difference between the peak voltage outputted from said holding circuit and said reference voltage.

5. An automatic gain control device according to claim 4, further comprising:
   a low-pass filter for removing a high-frequency component composed of a direct-current voltage from said control voltage outputted from said direct-current amplifying circuit.

6. An automatic gain control device according to claim 4, wherein
   said clamping circuit has a direct-current amplifying circuit for amplifying said reference voltage.

7. An automatic gain control device comprising:
   a variable gain amplifying circuit for amplifying or attenuating an input signal depending on a gain controlled by a control voltage;
   a rectifying circuit for rectifying an output signal of said variable gain amplifying circuit and outputting a first rectified voltage;
   a minute voltage detecting circuit for reversing the voltage level of the input signal of said variable gain amplifying circuit, while rectifying it, and outputting a second rectified voltage;
   a reference voltage generating circuit for supplying an appropriate reference voltage;
   a clamping circuit for limiting the second rectified voltage outputted from said minute voltage detecting circuit to a given value or lower depending on the value of said reference voltage;
   a low-pass filter for outputting an effective voltage of the higher one of the first rectified voltage outputted from said rectifying circuit and the second rectified voltage outputted from said minute voltage detecting circuit and limited by said clamping circuit;
   a direct-current amplifying circuit for outputting said control voltage based on a difference between the effective voltage outputted from said low-pass filter and said reference voltage.

8. An automatic gain control device according to claim 7, wherein
   said clamping circuit has a direct-current amplifying circuit for amplifying said reference voltage.

9. An automatic gain control device comprising:
   a variable gain amplifying circuit for amplifying or attenuating an input signal depending on a gain controlled by a control voltage;
   a switching circuit for switching between the input signal and an output signal of the variable gain amplifying circuit and selectively outputting either one of the input signal and the output signal;
   a rectifying circuit for rectifying an output signal of said switching circuit;
   an opening/closing circuit for opening and closing the voltage rectified by said rectifying circuit;
   a holding circuit for outputting a peak voltage of said rectified voltage via said opening/closing circuit;
   an analog-to-digital converting circuit for converting said peak voltage to a digital signal;
   a storage circuit for storing output data from said analog-to-digital converting circuit;

a digital-to-analog converting circuit for converting the data read from said storage circuit to an analog signal; and a direct-current amplifying circuit for outputting said control voltage based on a difference between said peak voltage and an output voltage of said digital-to-analog converting circuit.

10. An automatic gain control device according to claim 9, further comprising a charging circuit for charging said holding circuit with the output voltage of said digital-to-analog converting circuit, while said switching circuit is outputting said input signal.

11. An automatic gain control device according to claim 9, further comprising:

a low-pass filter for removing a high-frequency component composed of a direct-current voltage from said control voltage outputted from said direct-current amplifying circuit.

12. An automatic gain control device according to claim 9, wherein said storage circuit is a nonvolatile memory.

13. An automatic gain control device according to claim 9, wherein said storage circuit consists of a volatile memory and a back-up circuit for holding a content of said volatile memory.

* * * * *